US012701713B2

(12) United States Patent
Lee et al.

(10) Patent No.: US 12,701,713 B2
(45) Date of Patent: Aug. 4, 2026

(54) FERROELECTRIC SEMICONDUCTOR DEVICE

(71) Applicant: Samsung Electronics Co., Ltd., Suwon-si (KR)

(72) Inventors: Hyunjae Lee, Suwon-si (KR); Jinseong Heo, Suwon-si (KR); Seunggeol Nam, Suwon-si (KR); Yunseong Lee, Suwon-si (KR); Dukhyun Choe, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 400 days.

(21) Appl. No.: 18/461,266

(22) Filed: Sep. 5, 2023

(65) Prior Publication Data

US 2024/0081080 A1     Mar. 7, 2024

(30) Foreign Application Priority Data

Sep. 5, 2022     (KR) ......................... 10-2022-0112346
Sep. 4, 2023     (KR) ......................... 10-2023-0117216

(51) Int. Cl.
H10B 51/20          (2023.01)

(52) U.S. Cl.
CPC .................................... H10B 51/20 (2023.02)

(58) Field of Classification Search
CPC ................................ H10B 51/20; H10B 51/30
See application file for complete search history.

(56) References Cited

U.S. PATENT DOCUMENTS

| | | | |
|---|---|---|---|
| 6,063,639 A | 5/2000 | Kim et al. | |
| 10,475,813 B2 * | 11/2019 | Yoo ..................... | H01L 21/022 |
| 10,847,541 B2 * | 11/2020 | Yoo ..................... | G11C 11/2275 |
| 11,195,938 B2 | 12/2021 | Lin et al. | |
| 12,160,994 B2 * | 12/2024 | Ino ..................... | H10D 64/689 |
| 2004/0004244 A1 | 1/2004 | Ahn et al. | |
| 2019/0057860 A1 | 2/2019 | Yoon et al. | |
| 2021/0028273 A1 | 1/2021 | Yoon et al. | |
| 2021/0328065 A1 | 10/2021 | Lin et al. | |
| 2021/0359101 A1 | 11/2021 | Heo et al. | |
| 2021/0375930 A1 * | 12/2021 | Lu ..................... | H10B 51/20 |
| 2023/0068904 A1 | 3/2023 | Heo et al. | |

FOREIGN PATENT DOCUMENTS

| | | |
|---|---|---|
| KR | 2000-0027398 A | 5/2000 |
| KR | 2023-0030549 A | 3/2023 |

OTHER PUBLICATIONS

Lun Xu et al., "Kinetic pathway of the ferroelectric phase formation in doped $HfO_2$ films" J. Appl. Phys. 122, 124104 (2017); https://doi.org/10.1063/1.5003918.

* cited by examiner

*Primary Examiner* — Allison Bernstein
(74) *Attorney, Agent, or Firm* — Harness, Dickey & Pierce, P.L.C.

(57) ABSTRACT

A semiconductor device including a substrate, an interfacial layer on the substrate, a ferroelectric layer on the interfacial layer, a gate on the ferroelectric layer, and the nitride protective layer between the interfacial layer and the gate and being adjacent to the ferroelectric layer.

19 Claims, 20 Drawing Sheets

FERROELECTRIC SEMICONDUCTOR DEVICE

CROSS-REFERENCE TO RELATED APPLICATION

This application is based on and claims priority under 35 U.S.C. § 119 to Korean Patent Application Nos. 10-2022-0112346, filed on Sep. 5, 2022 and 10-2023-0117216, filed on Sep. 4, 2023, in the Korean Intellectual Property Office, the disclosure of each of which is incorporated by reference herein in its entirety.

BACKGROUND

1. Field

The disclosure relates to semiconductor devices including a ferroelectric layer and a nitride protective layer and an electronic device including the same.

2. Description of the Related Art

Ferroelectrics are materials having ferroelectricity and maintaining spontaneous polarization due to alignment of internal electric dipole moments even when an electric field is not applied thereto from the outside. In other words, ferroelectrics are materials in which polarization (or an electric field) remains semi-permanent even after a certain voltage is applied thereto and then the voltage is returned back to 0 V. Research has been conducted to improve the performance of devices by applying such ferroelectric characteristics to semiconductor devices. For example, research has been conducted to apply materials having a characteristic in which polarization values of ferroelectrics exhibit hysteresis with respect to a voltage change to a memory device.

Because it has been found that hafnium-based oxides have ferroelectricity, research on using hafnium-based oxides in semiconductor devices has also been conducted. Hafnium-based oxides are expected to be useful for miniaturization of semiconductor devices because hafnium-based oxides are friendly to semiconductor processes and have ferroelectricity even in a very thin film at the level of several nanometers.

SUMMARY

The disclosure provides semiconductor devices including a nitride protective layer and a ferroelectric layer, and an electronic device including the same.

Additional aspects will be set forth in part in the description which follows and, in part, will be apparent from the description, or may be learned by practice of the presented example embodiments of the disclosure.

According to an example embodiment of the disclosure, a semiconductor device may include a substrate, an interfacial layer on the substrate, a ferroelectric layer on the interfacial layer, a gate on the ferroelectric layer, and a nitride protective layer between the interfacial layer and the gate, the nitride protective layer being adjacent to the ferroelectric layer.

The nitride protective layer may include a ferroelectric material as base material and further includes nitrogen (N).

The ferroelectric material may include at least one of hafnium oxide, zirconium oxide, or hafnium-zirconium oxide.

A content of the nitrogen (N) included in the nitride protective layer may be greater than 0 at % and less than 6 at % relative to a content of a transition metal included in the ferroelectric material.

A content of the nitrogen (N) included in the nitride protective layer may be 1 at % or more and 5 at % or less relative to a content of a transition metal included in the ferroelectric material.

The transition metal may include hafnium (Hf).

The nitride protective layer may have a thickness of greater than 0 nm and less than 3.5 nm.

A thickness of the nitride protective layer may be 50% or less of a thickness of the ferroelectric layer.

The nitride protective layer may be between the ferroelectric layer and the gate.

The nitride protective layer may be between the interfacial layer and the ferroelectric layer.

The nitride protective layer may include a first nitride protective layer between the ferroelectric layer and the gate, and a second nitride protective layer between the interfacial layer and the ferroelectric layer.

The ferroelectric layer may include at least one of hafnium oxide, zirconium oxide, or hafnium-zirconium oxide.

The ferroelectric layer may further include a dopant of at least one of Sr, La, Al, Si, Gd, or Y.

A thickness of the ferroelectric layer may be 4 nm or more and 20 nm or less.

A memory window may be 0.5 V or more.

According to an example embodiment of the disclosure, a semiconductor device may include a substrate, an interfacial layer on the substrate, a ferroelectric layer on the interfacial layer, the ferroelectric layer including nitrogen and at least one of hafnium oxide, zirconium oxide, or hafnium-zirconium oxide, and a gate on the ferroelectric layer, wherein a content of nitrogen in the ferroelectric layer is greater than 0 at % and less than 6 at % relative to a content of a transition metal included in the ferroelectric layer.

The ferroelectric layer may include hafnium, and the content of nitrogen is 1 at % or more and 5 at % or less relative to the content of hafnium.

The nitrogen may be present in a certain region inside the ferroelectric layer, and the certain region may include at least one of a first region adjacent to the gate or a second region adjacent to the interfacial layer.

A thickness of the certain region inside the ferroelectric layer may be 50% or less of a total thickness of the ferroelectric layer.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
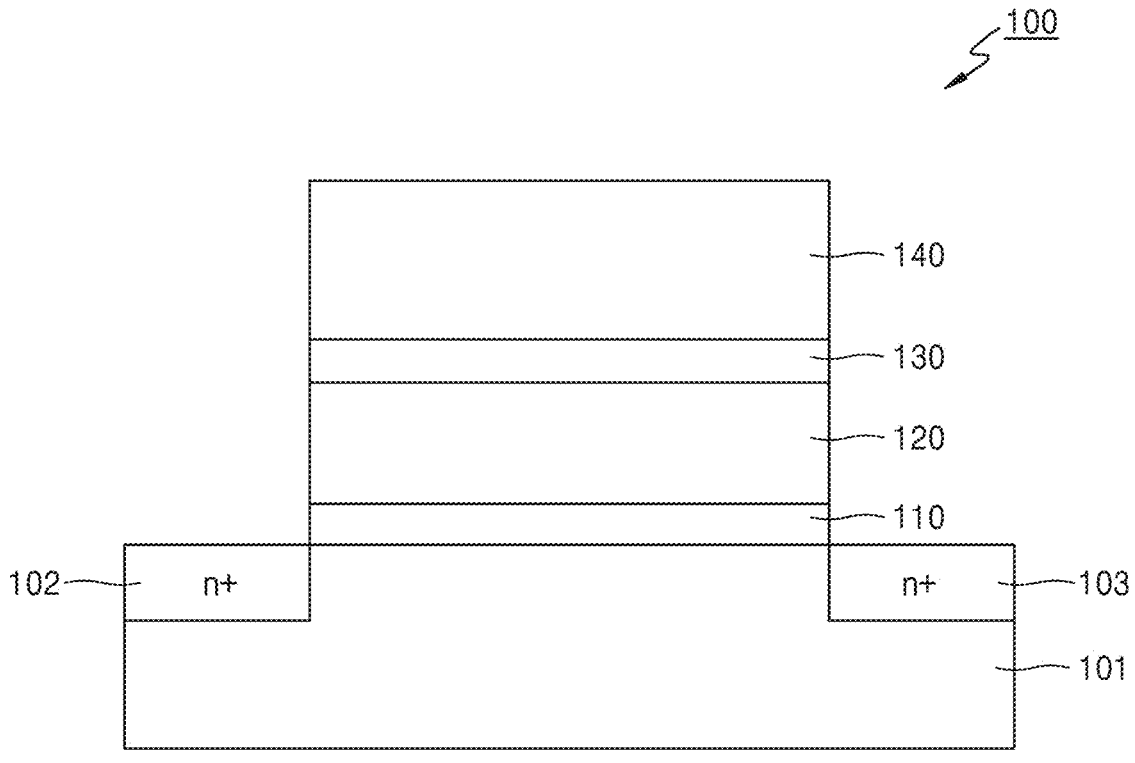
FIG. 1 illustrates a semiconductor device according to an example embodiment.

Reference will now be made in detail to some example embodiments, which are illustrated in the accompanying drawings, wherein like reference numerals refer to like elements throughout. In this regard, the present example embodiments may have different forms and should not be construed as being limited to the descriptions set forth herein. Accordingly, the disclosed example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments are described in detail with reference to the accompanying drawings. In the accompanying drawings, like reference numerals refer to like elements throughout. The thickness or size of each layer illustrated in the drawings may be exaggerated for convenience of explanation and clarity. Meanwhile, the disclosed example embodiments to be described are merely examples, and various modifications may be made from such example embodiments.

When an expression "above" or "on" may include not only "directly on/under/at left/right contactually", but also "on/under/at left/right contactlessly". Singular forms include plural forms unless apparently indicated otherwise contextually. It will be further understood that when a portion is referred to as "comprises" a component, the portion may not exclude another component but may further include another component unless stated otherwise.

The use of the term "the" and similar referents in the context of describing the disclosure are to be construed to cover both the singular and the plural. The operations of all methods described herein may be performed in any suitable order unless otherwise indicated herein or otherwise clearly contradicted by context, and embodiments are not limited to the described order of the operations.

Moreover, the terms "portion", "module," etc. refer to a unit processing at least one function or operation, and may be implemented by a hardware, a software, or a combination thereof.

The connecting lines, or connectors shown in the various figures presented are intended to represent functional relationships and/or physical or logical couplings between the various elements, and thus it should be noted that many alternative or additional functional relationships, physical connections or logical connections may be present in a practical device.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The use of any and all examples, or example language provided herein, is intended merely to better illuminate technical ideas and does not pose a limitation on the scope of example embodiments unless otherwise claimed.

FIG. 1 illustrates a semiconductor device 100 according to an example embodiment.

Referring to FIG. 1, in the semiconductor device 100, a gate 140 may be spaced apart from and disposed on a substrate 101, and a ferroelectric layer 120 and a nitride protective layer 130 may be disposed between the substrate 101 and the gate 140. In addition, an interfacial layer 110 may be disposed between the substrate 101 and the ferroelectric layer 120.

The substrate 101 may include a semiconductor material. For example, the substrate 101 may include a group IV semiconductor material. The group IV semiconductor material may include at least one of Si, Ge, or SiGe. However, example embodiments of the disclosure are not limited thereto. A dopant doped in the group IV semiconductor material may be a p-type dopant or an n-type dopant. The p-type dopant may include, for example, at least one of B, Al, Ga, or In. For example, the n-type dopant may include at least one of Ph, As, or Sb. For example, the semiconductor substrate 101 may be a p-Si substrate in which Si is doped with the p-type dopant or an n-Si substrate in which Si is doped with the n-type dopant. However, this is merely an example.

The substrate 101 may include a second region 102 and a third region 103 spaced apart from each other, and may include a first region (not shown) between the second region 102 and the third region 103. The first region may operate as a channel of the semiconductor device 100. The second region 102 and the third region 103 may be doped with a dopant on a substrate material to have a certain polarity, and the first region may have a polarity different from polarities of the second region 102 and the third region 103. For example, the semiconductor substrate 101 may include the first region doped with the p-type dopant and the second region 102 and the third region 103 doped with the n-type dopant. In some example embodiments, the semiconductor substrate 101 may include the first region doped with the p-type dopant, and the second region 102 and the third region 103 doped with the p-type dopant. The p-type dopant may include at least one of B, Al, Ga, or In. The n-type dopant may include at least one of Ph, As, or Sb. However, the disclosure is not necessarily limited thereto.

The semiconductor device 100 may further include a semiconductor thin film (not shown) on the substrate 101. The semiconductor thin film (not shown) may operate as a channel of the semiconductor device 100. The semiconductor thin film (not shown) may include at least one from the group consisting of an oxide semiconductor, a nitride semiconductor, an oxynitride semiconductor, a two-dimensional (2D) material, a quantum dot (QD), an organic semiconductor, and combinations thereof, as well as semiconductor materials such as Si, Ge, SiGe, group III-V, etc. For example, the oxide semiconductor may include InGaZnO, the 2D material may include transition metal dichalcogenide (TMD) or graphene, and the QD may include a colloidal QD, a nanocrystal structure, etc. Also, in the semiconductor device 100, the second region 102 and the third region 103 may include a conductive material, and may each independently include a metal, a metal compound, or a conductive polymer.

The semiconductor device 100 may further include the interfacial layer 110 on the substrate 101. The interfacial layer 110 may suppress or prevent electrical leakage. The interfacial layer 110 may include a paraelectric material or a high-k dielectric material, and may be an amorphous material. For example, the interfacial layer 110 may include at least one of silicon oxide, silicon nitride, aluminum oxide, germanium oxide, germanium oxynitride, silicon oxynitride, lanthanum oxide, yttrium oxide, or combinations thereof. For example, the interfacial layer 110 may include at least one of $SiO_2$, $GeO_2$, $SiGeO_4$, SiON, GeON, or SiGeON, but is not limited thereto.

A thickness of the interfacial layer 110 may be 0.1 nm or more, 0.3 nm or more, or 0.5 nm or more, and 5 nm or less, 4 nm or less, 3 nm or less, 2 nm or less, or 1 nm or less.

The gate 140 may be disposed on the substrate 101 to be spaced apart from the substrate 101 and may be disposed to face the first region or a channel (not shown). The gate 140 may include a conductive material such as metal, metal nitride, metal oxide, metal carbide, polysilicon, etc. The gate 140 may have a structure in which a plurality of materials are stacked. For example, the gate 140 may include at least one of Al, Ti, W, TiN, TaN, WN, NbN, Mo, Ru, Jr, RuO, IrO, or polysilicon. A thickness of the gate 140 (a thickness in a direction perpendicular to the substrate 101) may be approximately 5 nm or more and approximately 100 nm or less.

The ferroelectric layer 120 may have a spontaneous electric dipole (e.g., a spontaneous polarization) due to a non-centrosymmetric charge distribution in a unit cell in a crystallized material structure. In addition, the ferroelectric layer 120 has a remnant polarization by the electric dipole even in the absence of an external electric field. In addition, a polarization direction of the ferroelectric layer 120 may be switched in units of domains by an external electric field.

The ferroelectric layer 120 may include a fluorite-based material or perovskite. Perovskite may include, for example, PZT, $BaTiO_3$, $PbTiO_3$ etc. The fluorite-based material may include, for example, at least one oxide of Hf, Si, Al, Zr, Y, La, Gd, or Sr. For example, the ferroelectric layer 120 may include at least one of hafnium oxide (Hf oxide), zirconium oxide (Zr oxide), or hafnium-zirconium oxide (Hf—Zr oxide), and may further include a dopant of at least one of Si, Al, La, Y, Sr, or Gd. Hf oxide, Zr oxide, or Hf—Zr oxide may include an orthorhombic crystal system.

A thickness of the ferroelectric layer 120 may be about 1 nm or more, about 2 nm or more, or about 3 nm or more, and about 20 nm or less, about 15 nm or less, or about 10 nm or less. For example, the thickness of the ferroelectric layer 120 may be about 4 nm or more and about 20 nm or less. The thickness may be measured according to a method known in the art, for example, an ellipsometer (SE MG-1000, Nano View), a transmission electron microscope (TEM), etc.

Figure 2:
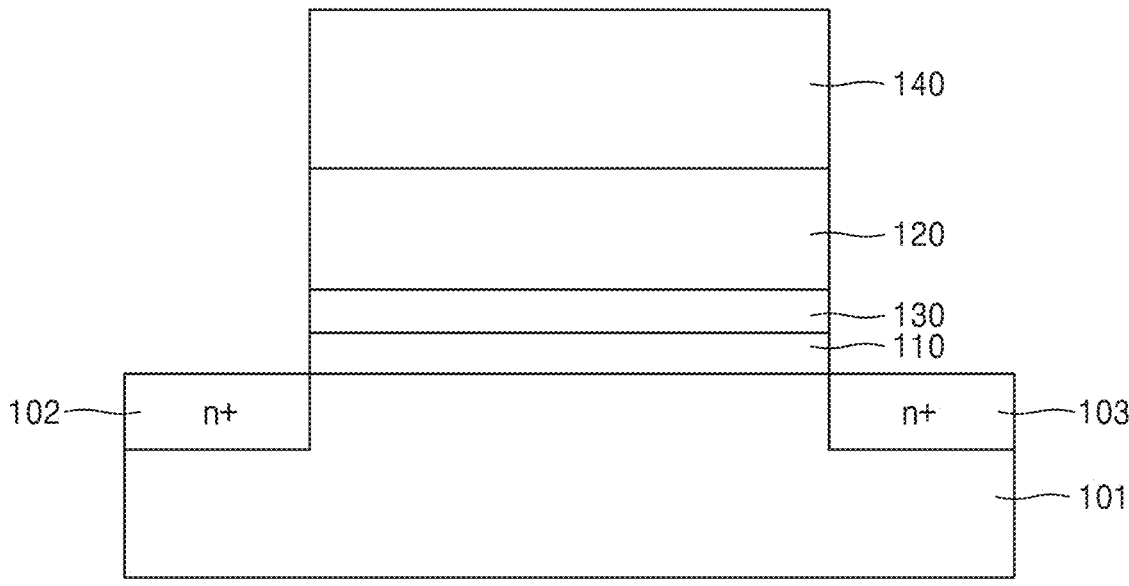
FIG. 2 illustrates a semiconductor device according to an example embodiment.
Figure 3:
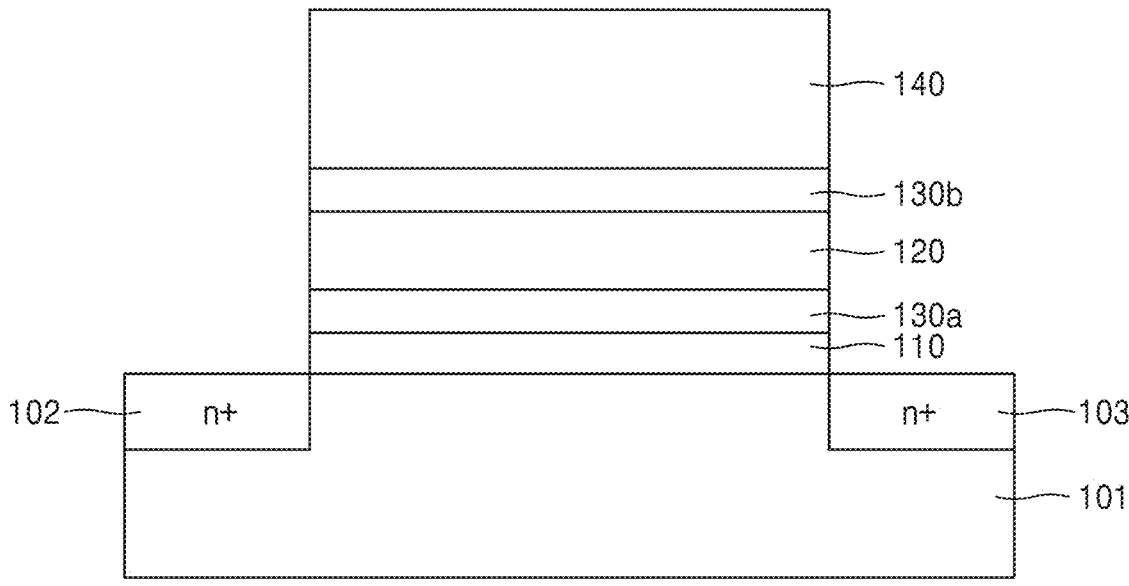
FIG. 3 illustrates semiconductor devices according to an example embodiment.

The nitride protective layer 130 may be disposed adjacent to the ferroelectric layer 120. For example, as shown in FIGS. 1, 2, and 3, a nitride protective layer 130, 130*a*, or 130*b* may be disposed between the ferroelectric layer 120 and the gate 140, between the ferroelectric layer 120 and the substrate 101 (e.g., between the ferroelectric layer 120 and the interfacial layer 110), or between the ferroelectric layer 120 and the gate 140 and between the ferroelectric layer 120 and the substrate 101 (e.g., between the ferroelectric layer 120 and the interfacial layer 110). In other words, the nitride protective layer 130 may be disposed between the interfacial layer 110 and the gate 140, and may be adjacent to the ferroelectric layer 120 with no intervening layer therebetween.

The nitride protective layer 130 may improve performance of the semiconductor device 100.

Semiconductor devices may require a high memory window to secure storage capacity and improve reliability. The memory window is defined as a difference in threshold voltages between a write operation and an erase operation in a semiconductor device. The high memory window means that there is no difference in threshold voltages between the write operation and the erase operation of the semiconductor device.

A write operation and an erase operation of the semiconductor device 100 are performed through polarization switching of the ferroelectric layer 120. At this time, an electric field stronger than a coercive field applied to the ferroelectric layer 120 may degrade the ferroelectric layer 120. For example, during the write/erase operation of the semiconductor device 100, electrons may be trapped or tunneling of electrons may occur in the ferroelectric layer 120. In addition, oxygen vacancies and impurities may exist inside the ferroelectric layer 120, and may act as traps for electrons during the write/erase operation of the semiconductor device 100. Thus, the semiconductor device 100 including the ferroelectric layer 120 may have a low memory window and poor endurance.

The nitride protective layer 130 may be disposed adjacent to the ferroelectric layer 120 to passivate a surface of the ferroelectric layer 120 and mitigate or prevent deterioration of the ferroelectric layer 120. In other words, the nitride protective layer 130 may be formed on one side of the ferroelectric layer 120 with no intervening layer therebetween.

In addition, the nitride protective layer 130 may suppress an electron diffusion between the ferroelectric layer 120 and an adjacent layer (e.g., the gate 140). The nitride protective layer 130 may increase a memory window of the semiconductor device 100 and improve endurance of the semiconductor device 100.

The nitride protective layer 130 may include a ferroelectric material as a base material and further include nitrogen. For example, the nitride protective layer 130 may include at least one of Hf oxide, Zr oxide, or Hf—Zr oxide, and may further include nitrogen. The nitride protective layer 130 may further include a dopant of at least one of Si, Al, La, Y, Sr, or Gd. Hf oxide, Zr oxide, or Hf—Zr oxide may include an orthorhombic crystal system.

A content of nitrogen (N) included in the nitride protective layer 130 may be greater than 0 at % and less than 6 at % relative to a content of a transition metal included in the nitride protective layer 130. For example, when the nitride protective layer 130 includes Hf oxide, Zr oxide, or Hf—Zr oxide as the base material, the content of nitrogen (N) included in the nitride protective layer 130 may be greater than 0 at %, 0.5 at % or more, or 1.0 at % or more compared to hafnium (Hf), and less than 6 at %, 5.5 at % or less, or 5 at % or less compared to hafnium (Hf). For example, the content of nitrogen (N) included in the nitride protective layer 130 may be greater than 1.0 at and less than 5 at % compared to hafnium (Hf). When nitrogen (N) is excessively included in the nitride protective layer 130, the memory window of the semiconductor device 100 may be lowered.

A thickness of the nitride protective layer 130 may be greater than about 0 nm and less than about 3.5 nm. The thickness of the nitride protective layer 130 may be about 50% or less, about 40% or less, or about 30% or less of the thickness of the ferroelectric layer 120.

An element type, content, and thickness of the nitride protective layer 130 may be measured according to a method known in the art (e.g., secondary ion mass spectrometry (SIMS), TEM, etc.).

The nitride protective layer 130 may be formed by nitride-treating the base material. For example, the nitride protective layer 130 may be formed by plasma-treating a layer including Hf—Zr oxide with a nitride gas. Alternatively, a part of the ferroelectric layer 120 may be formed as the nitride protective layer 130 by plasma-treating a surface of the ferroelectric layer 120 with the nitride gas. The nitride gas may include at least one of $NH_3$, $N_2H_4$, or $N_2$ including nitrogen atoms. A nitride treatment time may be determined according to a nitride treatment method, a type of nitride gas, a type of metal element in the nitride protective layer 130, a desired nitrogen content in the nitride protective layer 130, etc. For example, the nitride treatment time may be greater than 0 minute and 10 minutes or less.

Figure 4A:
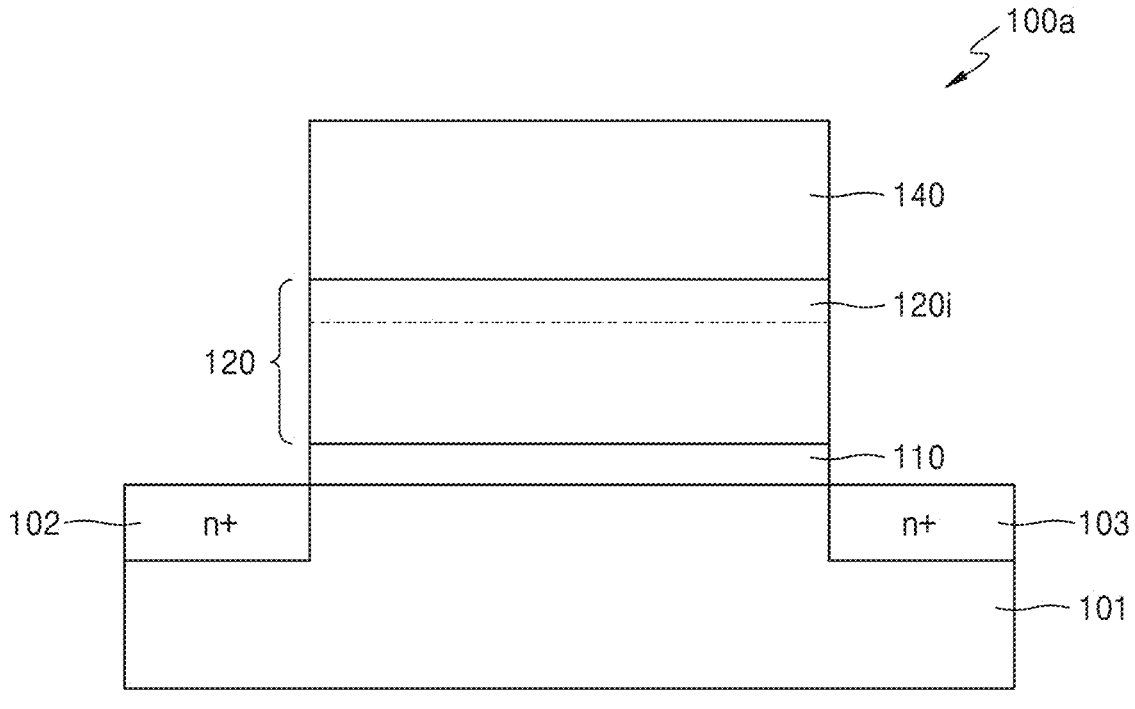
FIGS. 4A, 4B, and 4C illustrate semiconductor devices according to some example embodiments.
Figure 4B:
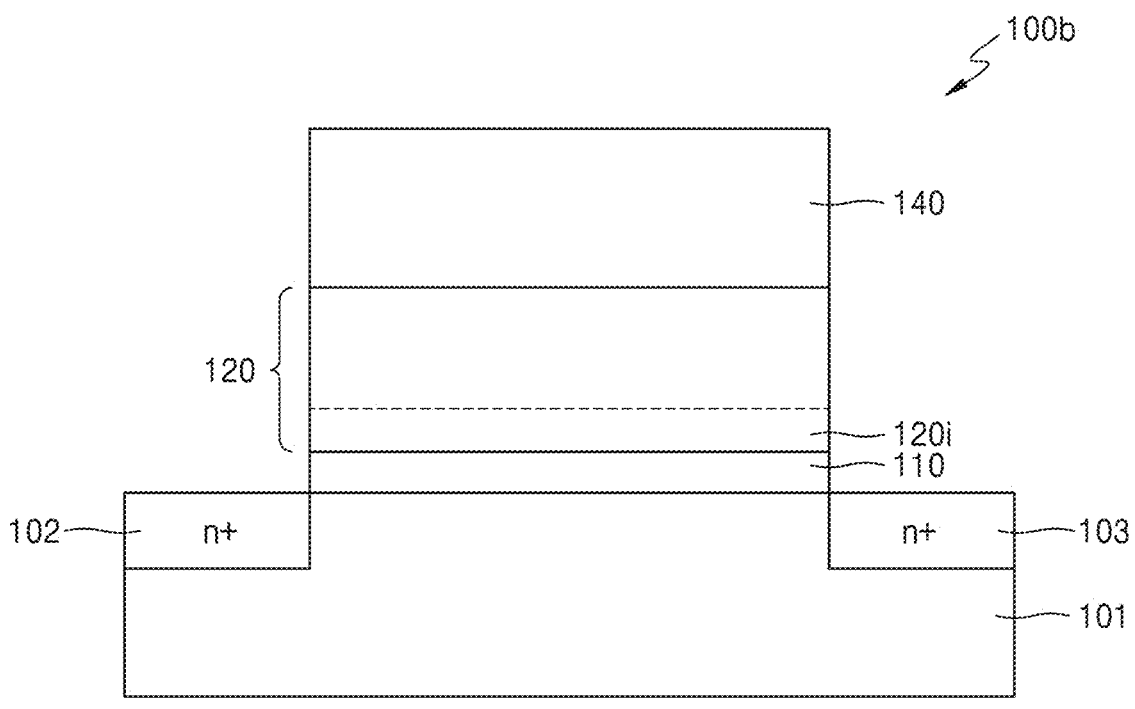
Figure 4C:
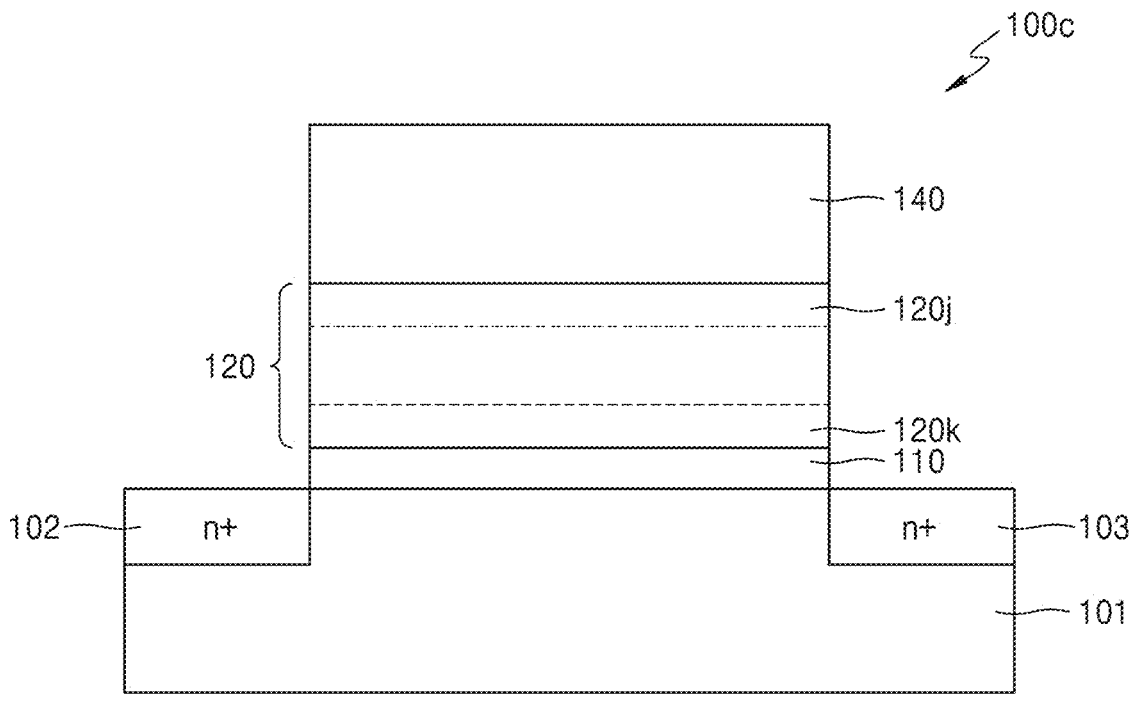

FIGS. 4A, 4B, and 4C illustrate semiconductor devices 100a, 100b, and 100c according to some example embodiments, respectively.

Referring to FIGS. 4A, 4B, and 4C, the semiconductor device 100a, 100b, or 100c may include the gate 140 spaced apart from and disposed on the substrate 101, the ferroelectric layer 120 between the substrate 101 and the gate 140, and the interfacial layer 110 disposed between the substrate 101 and the ferroelectric layer 120. The ferroelectric layer 120 may further include nitrogen in boundary regions 120i, 120j, and 120k where the ferroelectric layer 120 and adjacent layers contact with each other. For example, the ferroelectric layer 120 may further include nitrogen in a region 120i where the ferroelectric layer 120 and the gate 140 contact with each other, the region 120i where the ferroelectric layer 120 and the interfacial layer 110 contact with each other, or both regions 120j (where the ferroelectric layer 120 and the gate 140 contact with each other) and 120k (where the ferroelectric layer 120 and the interfacial layer 110 contact with each other).

A thickness of each of the boundary regions 120i, 120j, and 120k of the ferroelectric layer 120 may be greater than about 0 nm and less than about 3.5 nm. The thickness of each of the boundary regions 120i, 120j, and 120k of the ferroelectric layer may be about 50% or less, about 40% or less, or about 30% or less of a total thickness of the ferroelectric layer 120.

A content of nitrogen included in the ferroelectric layer 120 may be greater than 0 at % and less than 6 at % relative to a content of a transition metal in the ferroelectric layer 120. For example, the content of nitrogen (N) in the boundary regions 120i, 120j, and 120k of the ferroelectric layer 120 may be greater than 0 at % and less than 6 at % relative to the content of the transition metal. For example, when the ferroelectric layer 120 includes Hf—Zr oxide, the content of nitrogen (N) included in the ferroelectric layer 120 may be greater than 0 at %, 0.5 at % or more, or 1.0 at % or more relative to hafnium (Hf), and may be less than 6 at %, 5.5 at % or less, or 5 at % or less relative to hafnium (Hf). When nitrogen (N) is excessively included in the ferroelectric layer 120, a memory window of the semiconductor device 100a, 100b, or 100c may be lowered.

Figure 5A:
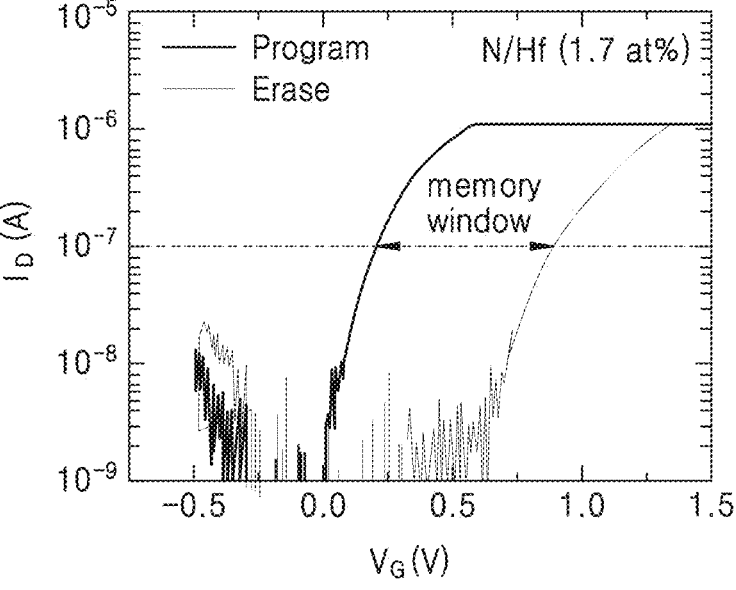
FIGS. 5A and 5B are diagrams illustrating a memory window of a semiconductor device according to some example embodiments.
Figure 5B:
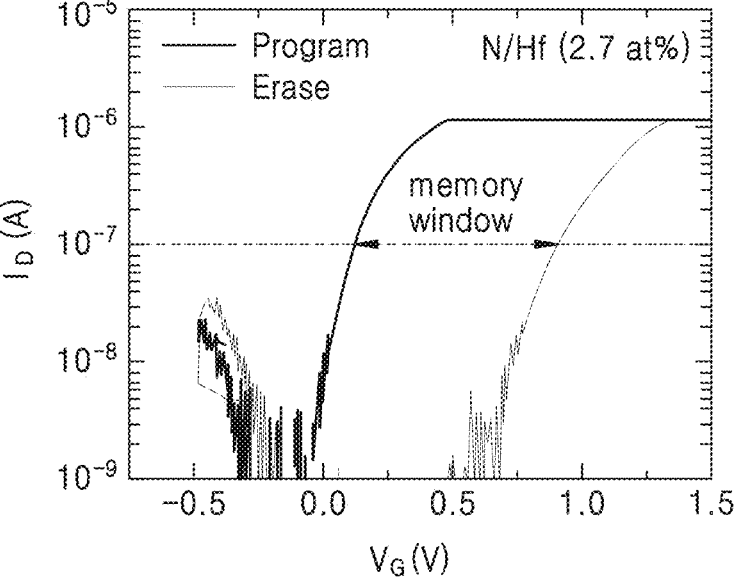

FIGS. 5A and 5B illustrate measurements of memory windows of a semiconductor device according to some example embodiments. The memory windows of the semiconductor device may be measured as a difference in threshold voltages between PROGRAM and ERASE at a specific current (e.g., $10^{-7}$ amperes (A)). For example, FIGS. 5A and 5B show, in the semiconductor device 100 of FIG. 1 including the ferroelectric layer 120 and the nitride protective layer 130 having the same thickness, a case where a content of nitrogen (N) in the nitride protective layer 130 including Hf—Zr oxide as a base material is 1.7 at % relative to Hf (FIG. 5A) and a case where a content of nitrogen (N) in the nitride protective layer 130 is 2.7 at % relative to Hf (FIG. 5B), respectively. Referring to FIGS. 5A and 5B, the memory windows of the semiconductor device are about 0.6 V and about 0.8 V, respectively. Therefore, it may be confirmed that the memory window of the semiconductor device may be improved to about 0.5 V or more according to the presence of the nitride protective layer 130 and the content of nitrogen (N) in the nitride protective layer 130.

Figure 6A:
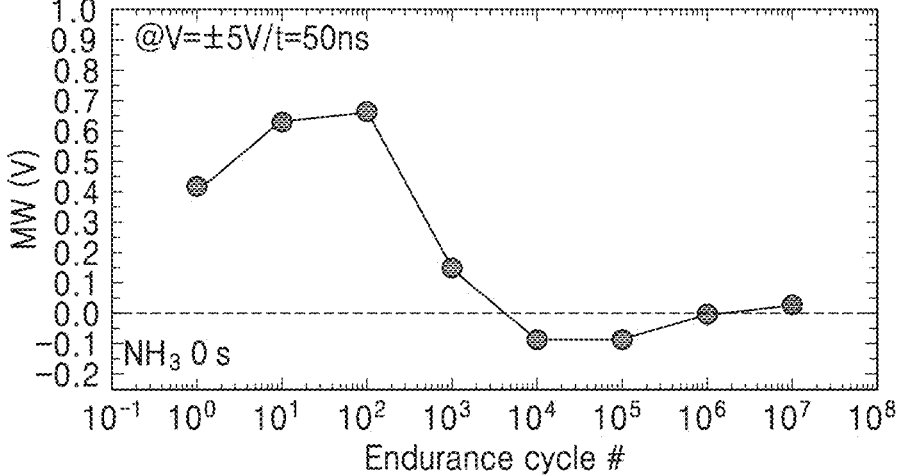
FIGS. 6A to 6C are diagrams illustrating endurance of semiconductor devices according to some example embodiments and a comparative example.
Figure 6B:
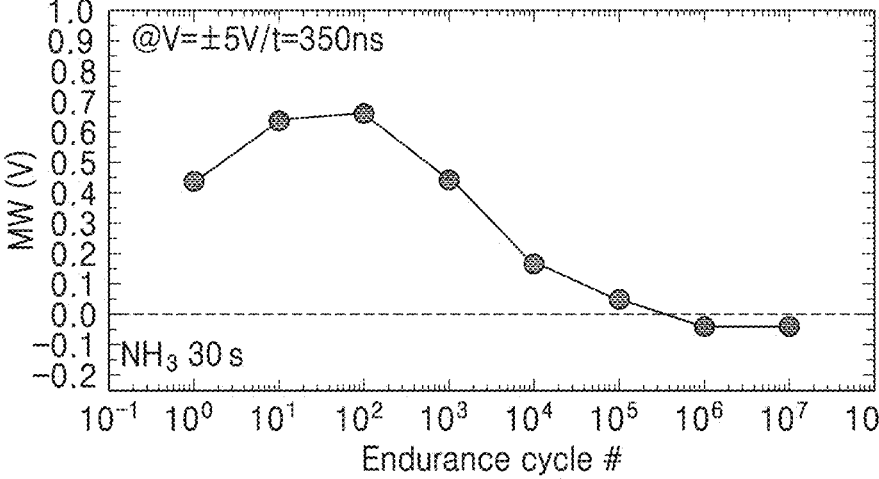
Figure 6C:
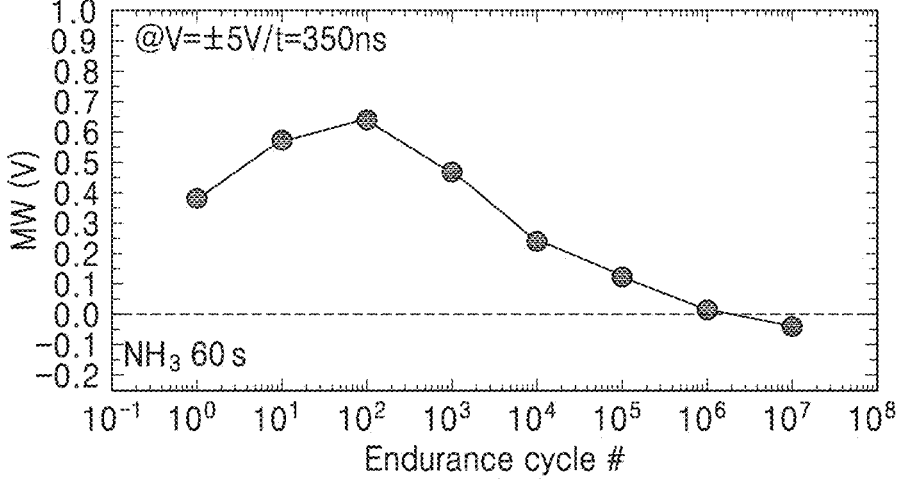

FIGS. 6A to 6C are measurements of endurance of a semiconductor device according to some example embodiments and comparative examples. A write/erase of the semiconductor device is defined as one cycle, and the number of cycles at which a memory window is lowered to less than 0.0 V is defined as the endurance of the semiconductor device by repeatedly checking the memory window after operating the semiconductor device for $10^N$ cycles.

FIG. 6A shows the semiconductor device including an Hf—Zr oxide ferroelectric layer and not including a nitride protective layer, and FIGS. 6B and 6C show the semiconductor device including an Hf—Zr oxide ferroelectric layer and a nitride protective layer formed by treating a surface of the ferroelectric layer with ammonia plasma for 30 seconds and 60 seconds, respectively. Referring to FIGS. 6A to 6C, an endurance cycle of the semiconductor device of FIGS. 6B and 6C is about $10^{5.5}$ and about $10^{6.1}$, respectively, and an endurance cycle of the semiconductor device of FIG. 6A is about $10^4$. It may be confirmed from the above that the endurance of the semiconductor device may be improved according to the presence of the nitride protective layer 130 and the content of nitrogen (N) in the nitride protective layer 130.

Figure 7:
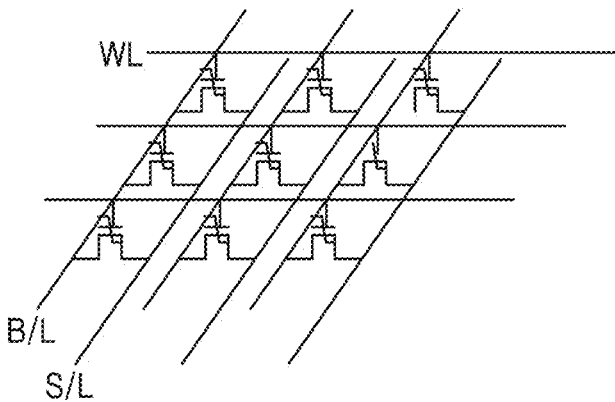
FIG. 7 is an equivalent circuit diagram of a memory device including the semiconductor device according to the example embodiment shown in FIG. 1.

FIG. 7 is an equivalent circuit diagram of a memory device including a semiconductor device according to the example embodiment shown in FIG. 1.

Referring to FIG. 7, the semiconductor device may include an array of a plurality of semiconductor devices 100 that are two-dimensionally (2D) arranged. Further, the semiconductor device may include a plurality of bit lines BL, a plurality of selection lines SL, and a plurality of word lines WL. The selection line SL may be electrically connected to a first source/drain region of the semiconductor device 100, the bit line BL may be electrically connected to a second source/drain region of the semiconductor device 100, and the plurality of word lines WL may be electrically connected to a gate of the semiconductor device 100. In addition, the semiconductor device may further include an amplifier (not shown) amplifying a signal output from the bit line BL.

FIGS. 1 to 3 are shown as 2D planes for convenience, but the semiconductor device may have a stacked structure of two or more stages. For example, the plurality of bit lines BL and the plurality of selection lines SL extending in a vertical direction may be 2D arranged, and the plurality of word lines WL extending in a horizontal direction may be arranged in a plurality of layers, respectively. However, example embodiments of the disclosure are not necessarily limited thereto, and memory cells may be 3D arranged in various ways.

Figure 8:
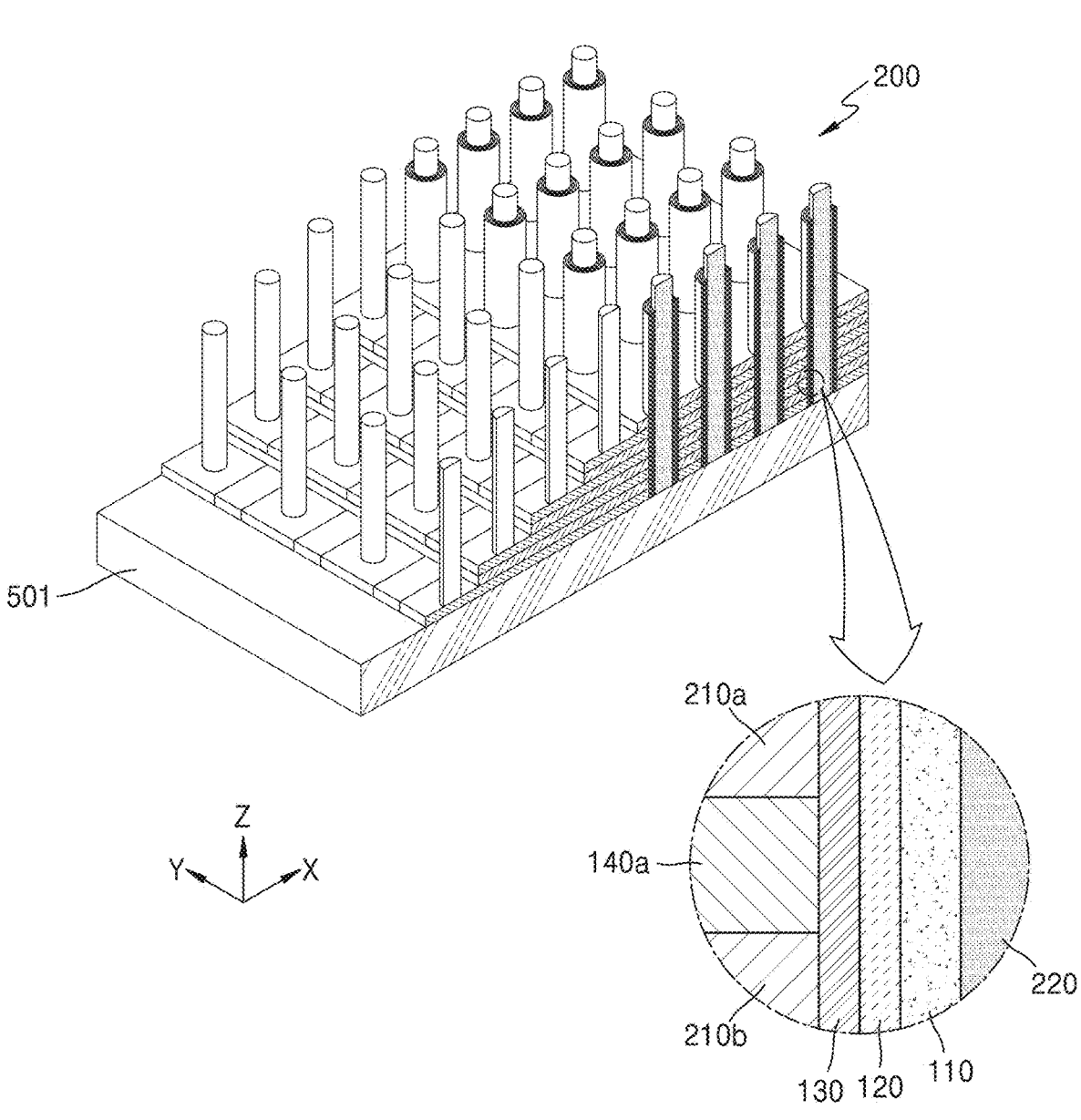
FIG. 8 illustrates a semiconductor device according to an example embodiment.

FIG. 8 is a perspective view schematically illustrating a structure of a semiconductor device according to an example embodiment.

Referring to FIG. 8, a semiconductor device 200 may include a stacked structure in which a plurality of insulating layers 210 (e.g., 210a and 210b) and a plurality of gates 140a are alternately and repeatedly stacked, and the ferroelectric layer 120, the interface layer 110, a channel (not shown), the nitride protective layer 130, and a dielectric filler 220 may be disposed to penetrate the stacked structure. The ferroelectric layer 120 may be the ferroelectric layer included in the semiconductor device 100 according to the above-described example embodiments. For example, the plurality of insulating layers 210 and the plurality of gates 140a may extend along the X-Y plane on a substrate 501, and alternately and repeatedly stacked in a Z direction to form the stacked structure. The semiconductor device 200 may include a cell string including the ferroelectric layer 120, the interfacial layer 110, the channel (not shown), the nitride protective layer 130, and the dielectric filler 220, and the cell string may be disposed to penetrate the stacked structure. In other words, the insulating layer 210 and the gate 140 may be disposed to surround a periphery of the cell string. For example, the ferroelectric layer 120, the interfacial layer 110, the channel (not shown), the nitride protective layer 130, and the dielectric filler 220 may all extend in the Z direction to intersect the insulating layer 210 and the gate 140. In addition, the dielectric filler 220 may be disposed at the center of the cell string, and the ferroelectric layer 120, the interfacial layer 110, the nitride protective layer 130, and the channel (not shown) may be disposed to surround the dielectric filler 220. The interfacial layer 110 may be disposed between the ferroelectric layer 120 and the channel (not shown). The semiconductor device 200 may include a plurality of cell strings, and the cell strings may be spaced apart on the X-Y plane and 2D arranged.

Structures and materials of the substrate 501, the interfacial layer 110, the ferroelectric layer 120, and the nitride protective layer 130 of the ferroelectric semiconductor device 200 according to this example embodiment are the same as those described with reference to FIG. 1.

The ferroelectric semiconductor device 200 of FIG. 8 may be applied to a vertical NAND semiconductor device, and a highly integrated semiconductor device may be manufactured through a vertical structure. However, the ferroelectric semiconductor device 200 according to example embodiments are not necessarily limited to the vertical NAND semiconductor device.

Figure 9:
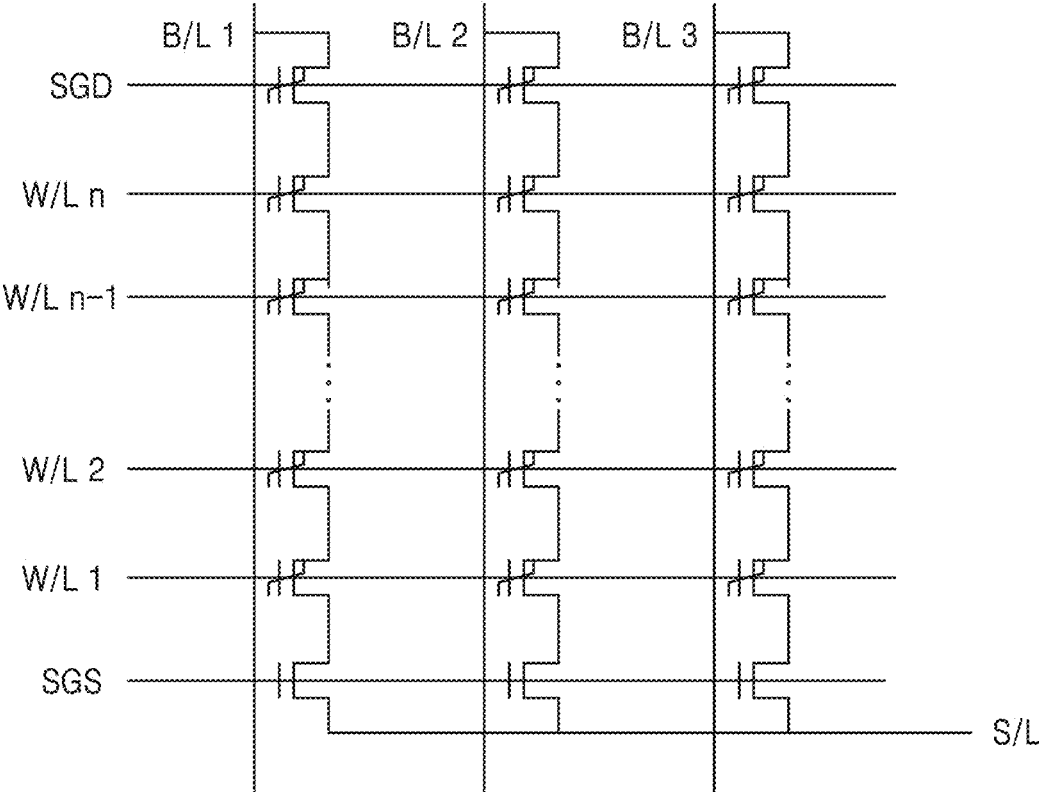
FIG. 9 is an equivalent circuit diagram of the semiconductor device according to the example embodiment shown in FIG. 8.

FIG. 9 is an equivalent circuit diagram of a memory array including a ferroelectric semiconductor device according to the embodiment shown in FIG. 8.

Referring to FIG. 9, a plurality of ferroelectric semiconductor devices are stacked in the memory array, a plurality of semiconductor devices 200 stacked in a direction perpendicular to the substrate 501 are connected in series through a source and a drain, and the gates 140 of the semiconductor devices 200 disposed in a direction parallel to the substrate 501 are electrically connected to the word lines WL.

Figure 10:
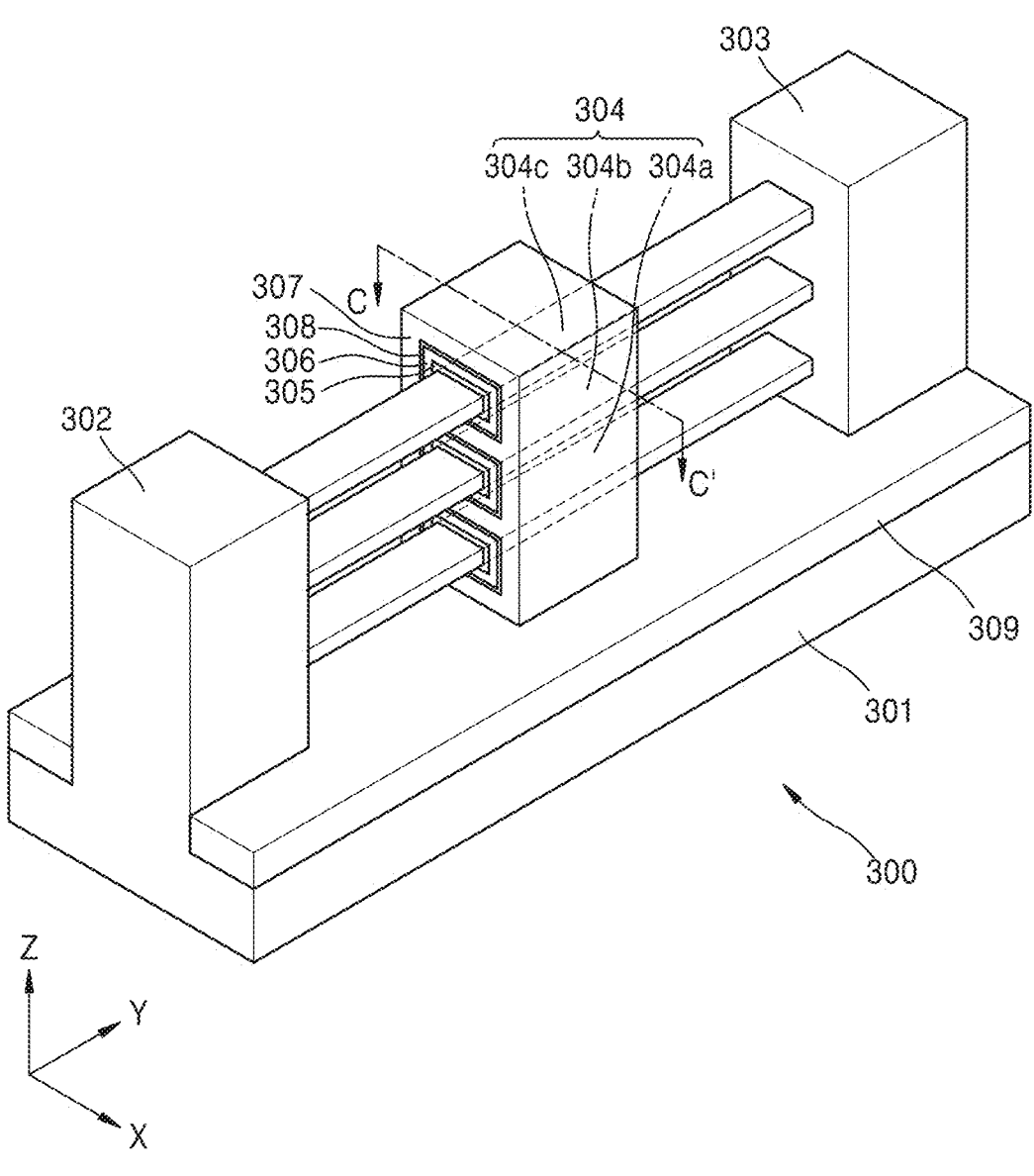
FIG. 10 is a perspective view schematically illustrating a structure of a semiconductor device according to an example embodiment.

FIG. 10 is a cross-sectional view schematically illustrating a structure of a semiconductor device according to an example embodiment.

Referring to FIG. 10, a semiconductor device 300 may include a substrate 301, a first source/drain region 302 protruding in a Z direction from an upper surface of the substrate 301, a second source/drain region 303 protruding in the Z direction from the upper surface of the substrate 301, a channel layer 304 having a bar shape extending in a Y direction and spaced apart from the upper surface of the substrate 301, an interfacial layer 305 covering to surround the channel layer 304, a ferroelectric layer 306 surrounding the interfacial layer 305, a nitride protective layer 308 surrounding the ferroelectric layer 306, and a gate 307 surrounding the nitride protective layer 308. The ferroelectric layer 306 may be the ferroelectric layer 120 provided in the semiconductor device 100 according to the above-described example embodiments. The channel layer 304 may include a plurality of channel elements 304a, 304b, and 304c arranged from each other by a distance in the Z direction or an X direction different from the Y direction. In addition, a device isolation layer 309 may be disposed between a plurality of semiconductor devices on the substrate 301 and form a certain insulating layer to block the adjacent semiconductor devices from being electrically connected to each other.

As described with reference to FIGS. 1 to 4C, the nitride protective layer 308 may be formed on one side of the ferroelectric layer 306, and may be formed between the ferroelectric layer 306 and the gate 307, but positions of the nitride protective layer 308 of example embodiments are not necessarily limited to such position(s).

FIG. 10 shows the three channel elements 304a, 304b, and 304c arranged by a distance in the Z direction, but this is merely an example and example embodiments are not necessarily limited thereto. The semiconductor device 300 shown in FIG. 10 may be, for example, a Gate-All-Around FET (GAAFET) or a Multi-Bridge-Channel FET (MBCFET).

Figure 11:
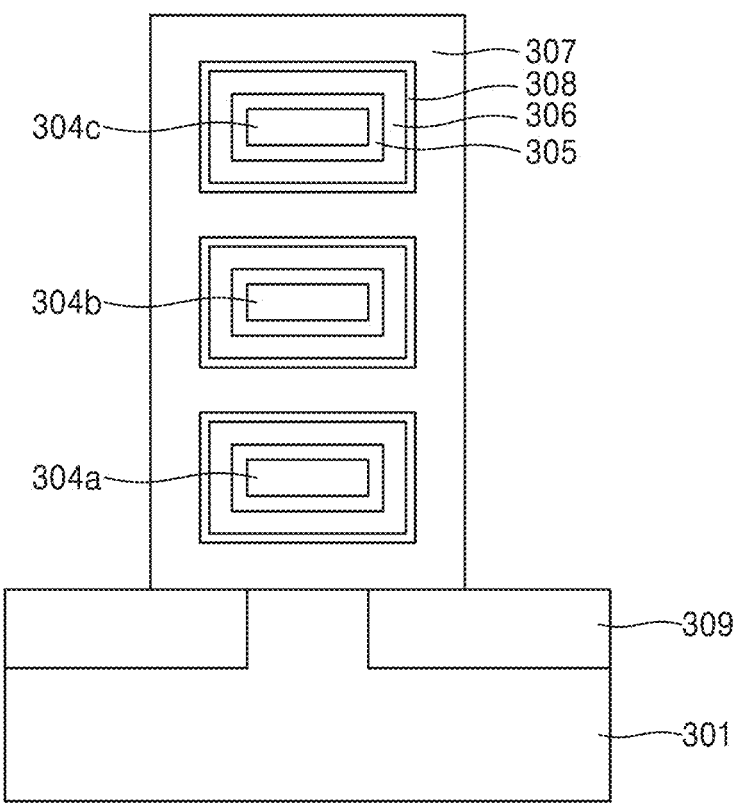
FIG. 11 is a cross-sectional view schematically illustrating the structure of the semiconductor device shown in FIG. 10.

FIG. 11 is a schematic cross-sectional view of the semiconductor device 300 shown in FIG. 10, and in particular, schematically shows a cross-section of the semiconductor device 300 cut in a direction C-C'. Referring to FIG. 11, the semiconductor device 300 may include a plurality of interfacial layers 305 surrounding four surfaces of the plurality of channel elements 304a, 304b, and 304c, respectively. In addition, the semiconductor device 300 may include a plurality of ferroelectric layers 306 surrounding four surfaces of the plurality of interfacial layers 305, respectively. The semiconductor device 300 may include a plurality of nitride protective layers 308 surrounding four surfaces of the plurality of ferroelectric layers 306, respectively. The gate 307 may have a structure extending in the Z direction by protruding from an upper surface of the substrate 301 to surround four surfaces of the channel elements 304*a*, 304*b*, and 304*c*.

As mentioned above, the nitride protective layer 308 may be formed on one side of the ferroelectric layer 306, have a high content of nitrogen, and formed at a certain position between the gate 307 and the ferroelectric layer 306, but example embodiments are not necessarily limited thereto.

As shown in FIG. 10, the device isolation layer 309 may be disposed between a plurality of semiconductor devices on the substrate 301 and form a certain insulating layer to block the adjacent semiconductor devices from being electrically connected to each other.

Figure 12:
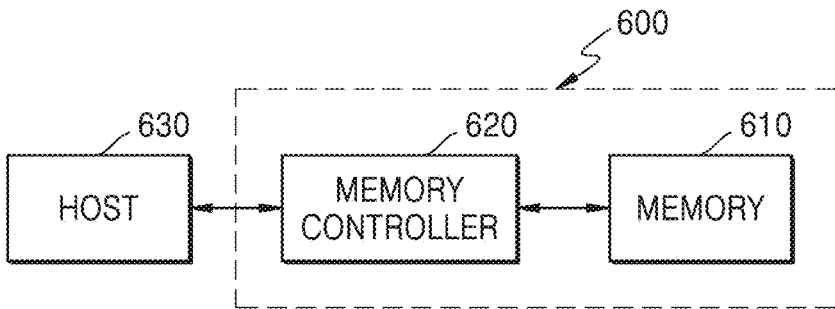
FIG. 12 is a block diagram of an electronic device according to an example embodiment.

FIG. 12 is a block diagram of an electronic device according to an example embodiment.

Referring to FIG. 12, an electronic device 600 includes a memory 610 and a memory controller 620. The memory controller 620 may control the memory 610 to read data from the memory 610 and/or write data to the memory 610 in response to a request from a host 630. The memory 610 may include a semiconductor device according to the above-described example embodiments.

Figure 13:
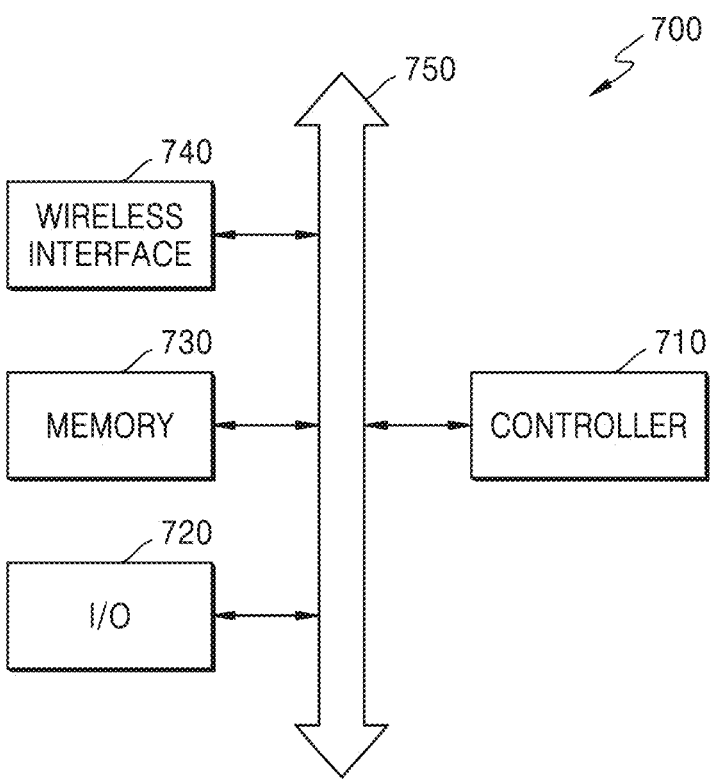
FIG. 13 is a block diagram of an electronic device according to an example embodiment.

FIG. 13 is a block diagram of an electronic device 700 according to an example embodiment.

Referring to FIG. 13, the electronic device 700 may constitute a wireless communication device or a device capable of transmitting and/or receiving information in a wireless environment. The electronic device 700 may include a controller 710, an input/output device (I/O) 720, a memory 730, and a wireless interface 740, which are interconnected via a bus 750.

The controller 710 may include at least one of a microprocessor, a digital signal processor, or a processing device similar thereto. The input/output device 720 may include at least one of a keypad, a keyboard, or a display. The memory 730 may be used to store instructions executed by the controller 710. For example, the memory 730 may be used to store user data. The electronic device 700 may use the wireless interface 740 to transmit/receive data over a wireless communication network. The wireless interface 740 may include an antenna and/or a wireless transceiver. In some embodiments, the electronic device 700 may be used for a communication interface protocol of a third generation communication system, such as code division multiple access (CDMA), global system for mobile communications (GSM), north American digital cellular (NADC), extended-time division multiple access (E-TDMA), and/or wide band code division multiple access (WCDMA). The memory 730 of the electronic device 700 may include a semiconductor device according to the above-described embodiments.

Figure 14:
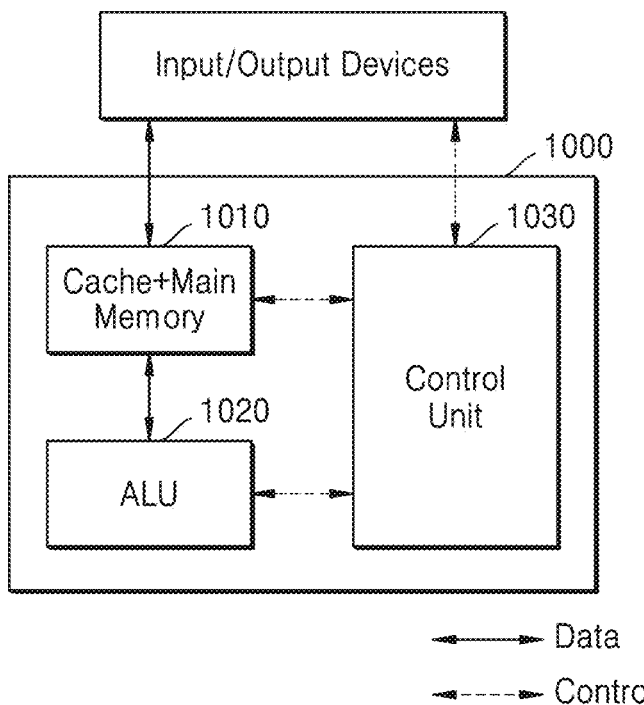
FIGS. 14 and 15 are conceptual diagrams schematically illustrating device architectures applicable to an electronic device according to some example embodiments.
Figure 15:
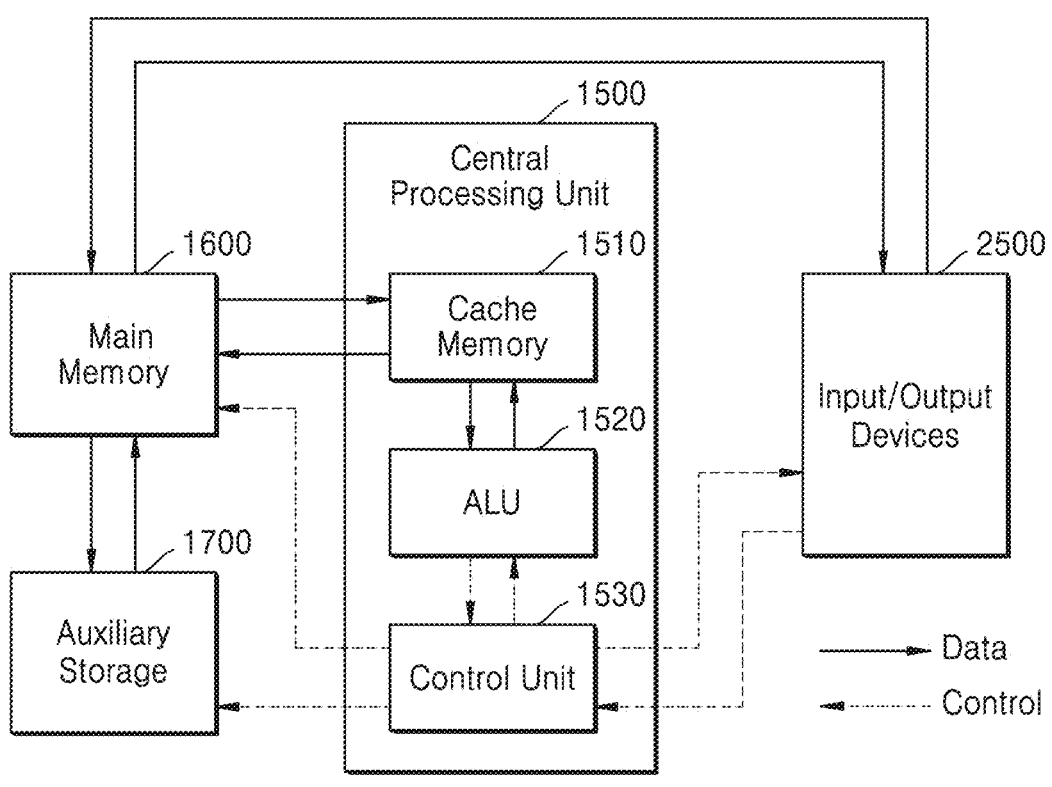

FIGS. 14 and 15 are conceptual diagrams schematically illustrating device architectures applicable to an electronic device according to some example embodiments.

Referring to FIG. 14, an electronic device architecture 1000 may include a memory unit 1010 and a control unit 1030, and may further include an arithmetic logic unit (ALU) 1020. The memory unit 1010, the ALU 1020 and the control unit 1030 may be electrically connected to each other. For example, the electronic device architecture 1000 may be implemented as a single chip including the memory unit 1010, the ALU 1020 and the control unit 1030. For example, the memory unit 1010, the ALU 1020, and the control unit 1030 may be connected to each other through a metal line on-chip and communicate directly. The memory unit 1010, the ALU 1020, and the control unit 1030 may be monolithically integrated on one substrate to form one chip. An input/output device 2000 may be connected to the electronic device architecture (chip) 1000. Further, the memory unit 1010 may include both a main memory and a cache memory. This electronic device architecture (chip) 1000 may be an on-chip memory processing unit. The memory unit 1010, the ALU 1020, and/or the control unit 1030 may independently include semiconductor devices according to the above-described example embodiments.

Referring to FIG. 15, a cache memory 1510, an ALU 1520, and a control unit 1530 may constitute a central processing unit (CPU) 1500, and the cache memory 1510 may be static random access memory (SRAM). Apart from the CPU 1500, a main memory 1600 and an auxiliary storage 1700 may be provided, and an input/output device 2500 may be provided. The main memory 1600 may be, for example, dynamic random access memory (DRAM) and may include a semiconductor device according to the above-described example embodiments.

In some cases, the electronic device architecture may be implemented in a form in which computing unit devices and memory unit devices are adjacent to each other in one chip without distinction of sub-units.

The semiconductor device according to some example embodiments may include a nitride protective layer adjacent to a ferroelectric layer, with no intervening layer therebetween, to protect defects in the ferroelectric layer and block charge transfer between a gate and the ferroelectric layer, thereby improving endurance of the semiconductor device and improving a memory window of the semiconductor device.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that some example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A semiconductor device comprising:
a substrate;
an interfacial layer on the substrate;
a ferroelectric layer on the interfacial layer;
a gate on the ferroelectric layer; and
a nitride protective layer between the interfacial layer and the gate, the nitride protective layer being adjacent to the ferroelectric layer,
wherein the nitride protective layer includes a ferroelectric material as a base material and further includes nitrogen (N), and a first content of the nitrogen (N) included in the nitride protective layer is greater than 0 at % and less than 6 at % relative to a second content of a transition metal included in the ferroelectric material.

2. The semiconductor device of claim 1, wherein the ferroelectric material includes at least one of hafnium oxide, zirconium oxide, or hafnium-zirconium oxide.

3. The semiconductor device of claim 1, wherein the first content of the nitrogen (N) included in the nitride protective layer is 1 at % or more and 5 at % or less relative to the second content of the transition metal included in the ferroelectric material.

4. The semiconductor device of claim 1, wherein the transition metal includes hafnium (Hf).

5. The semiconductor device of claim 1, wherein the nitride protective layer has a thickness of greater than 0 nm and less than 3.5 nm.

6. The semiconductor device of claim 1, wherein a thickness of the nitride protective layer is 50% or less of a thickness of the ferroelectric layer.

7. The semiconductor device of claim 1, wherein the nitride protective layer is between the ferroelectric layer and the gate.

8. The semiconductor device of claim 1, wherein the nitride protective layer is between the interfacial layer and the ferroelectric layer.

9. The semiconductor device of claim 1, wherein the nitride protective layer includes:

a first nitride protective layer between the ferroelectric layer and the gate; and a second nitride protective layer between the interfacial layer and the ferroelectric layer.

10. The semiconductor device of claim 1, wherein the ferroelectric layer includes at least one of hafnium oxide, zirconium oxide, or hafnium-zirconium oxide.

11. The semiconductor device of claim 10, wherein the ferroelectric layer further includes a dopant of at least one of Sr, La, Al, Si, Gd, or Y.

12. The semiconductor device of claim 1, wherein a thickness of the ferroelectric layer is 4 nm or more and 20 nm or less.

13. The semiconductor device of claim 1, wherein a memory window is 0.5 V or more.

14. A semiconductor device comprising:

a substrate;

an interfacial layer on the substrate;

a ferroelectric layer on the interfacial layer, the ferroelectric layer comprising nitrogen and at least one of hafnium oxide, zirconium oxide, or hafnium-zirconium oxide; and a gate on the ferroelectric layer, wherein a content of nitrogen in the ferroelectric layer is greater than 0 at % and less than 6 at % relative to a content of a transition metal included in the ferroelectric layer.

15. The semiconductor device of claim 14, wherein the ferroelectric layer includes hafnium, and the content of nitrogen is 1 at % or more and 5 at % or less relative to a content of hafnium.

16. The semiconductor device of claim 14, wherein the nitrogen is present in a certain region inside the ferroelectric layer, and the certain region includes at least one of a first region adjacent to the gate or a second region adjacent to the interfacial layer.

17. The semiconductor device of claim 16, wherein a thickness of the certain region inside the ferroelectric layer is 50% or less of a total thickness of the ferroelectric layer.

18. The semiconductor device of claim 1, wherein there is no intervening layer between the nitride protective layer and the ferroelectric layer.

19. A semiconductor device comprising:

a substrate;

an interfacial layer on the substrate;

a ferroelectric layer on the interfacial layer;

a gate on the ferroelectric layer; and a nitride protective layer between the ferroelectric layer and the gate, wherein the nitride protective layer includes a ferroelectric material as a base material and further includes nitrogen (N), and a first content of the nitrogen (N) included in the ferroelectric layer is less than a second content of the nitrogen (N) included in the nitride protective layer.

* * * * *